(12) United States Patent
Gulian et al.

(10) Patent No.: US 8,630,687 B2
(45) Date of Patent: Jan. 14, 2014

(54) SULFUR-INDUCED SUPERCONDUCTIVITY IN STRONTIUM RUTHENATES

(71) Applicant: AVD Conduction, Katy, TX (US)

(72) Inventors: Armen Gulian, Ashton, MD (US); Vahan Nikoghosyan, Ashton, MD (US); Dennis Winegarner, Katy, TX (US)

(73) Assignee: AVD Conduction, Katy, TX (US)

( * ) Notice: Subject to any disclaimer, the term of this patent is extended or adjusted under 35 U.S.C. 154(b) by 0 days.

(21) Appl. No.: 13/630,796

(22) Filed: Sep. 28, 2012

(65) Prior Publication Data

US 2013/0085070 A1    Apr. 4, 2013

Related U.S. Application Data

(60) Provisional application No. 61/541,737, filed on Sep. 30, 2011, provisional application No. 61/560,052, filed on Nov. 15, 2011.

(51) Int. Cl.
*H01L 39/12* (2006.01)
*H01L 39/24* (2006.01)
*H01B 1/06* (2006.01)

(52) U.S. Cl.
USPC ...... 505/150; 505/300; 505/725; 252/519.13; 423/592.1; 423/594.16; 502/223

(58) Field of Classification Search
USPC ......... 505/100, 110, 150, 300, 412, 470, 700, 505/725, 785, 950, 951; 427/62; 423/592.1, 423/594.16; 252/518.1, 519.1; 502/223
See application file for complete search history.

(56) References Cited

PUBLICATIONS

Maeno et al, "The Intriguing Superconductivity of Strontium Ruthenate," Physics Today, 2001, pp. 42-47.*

* cited by examiner

*Primary Examiner* — Stanley Silverman
*Assistant Examiner* — Kallambella Vijayakumar
(74) *Attorney, Agent, or Firm* — Foley & Lardner LLP

(57) ABSTRACT

In one aspect, a method is disclosed of making a material, the method including synthesizing a composition $Sr_2RuO_{4-y}S_y$, where y is in the range of, e.g., 0.1-1.2. In some embodiments y is in the range of 0.1-0.6. In some such embodiments, the material may exhibit a strong diamagnetic signal, e.g. of up to 5% of absolute diamagnetism ($\chi=-1/4\pi$) or more (e.g., at temperatures ranging from 4K-300K). In some embodiments, the material may exhibit high temperature superconductivity.

20 Claims, 7 Drawing Sheets

SULFUR-INDUCED SUPERCONDUCTIVITY IN STRONTIUM RUTHENATES

CROSS REFEREENCE TO RELATED APPLICATION

The present application claims the benefit of U.S. Provisional Application No. 61/541737 INDICATION OF MEISSNER EFFECT IN SULFUR-SUBSTITUTED STRONTIUM RUTHENATES filed Sep. 30, 2011 and U.S. Ser. No. 61/560052 SULFUR-INDUCED SUPERCONDUCTIVITY IN STRONTIUM RUTHENATES filed Nov. 15, 2011. The entire contents of each of the forgoing applications are incorporated herein by reference.

BACKGROUND

Superconductivity is a phenomenon characterized by zero electrical resistance occurring in certain materials below a characteristic temperature. It was discovered by Heike Kamerlingh-Onnes on Apr. 8, 1911 in Leiden. Like ferromagnetism and atomic spectral lines, superconductivity is a quantum mechanical phenomenon. It is further characterized by the Meissner effect, the complete ejection of magnetic field lines from the interior of the superconductor as it transitions into the superconducting state. The occurrence of the Meissner effect indicates that superconductivity cannot be understood simply as the idealization of perfect conductivity in classical physics.

The electrical resistivity of a metallic conductor decreases gradually as temperature is lowered. In ordinary conductors, such as copper or silver, this decrease is limited by impurities and other defects. Even near absolute zero, a real sample of a normal conductor shows some resistance. In a superconductor, the resistance drops abruptly to zero when the material is cooled below its critical temperature. An electric current flowing in a loop of superconducting wire can persist essentially indefinitely with no additional power source.

High-temperature superconductors are materials that have a superconducting transition temperature ($T_c$) above 30 K (−243.2° C.). From 1960 to 1980, 30 K was thought to be the highest theoretically possible $T_c$. The first high-$T_c$ superconductor was discovered in 1986 by IBM researchers Karl Müller and Johannes Bednorz, for which they were awarded the Nobel Prize in Physics in 1987.

SUMMARY

In one aspect, a method is disclosed of making a material, the method including synthesizing a composition $Sr_2RuO_{4-y}S_y$, where y is in the range of, e.g., 0.1-1.2. In some embodiments y is in the range of 0.1-0.6. In some such embodiments, the material may exhibit a strong diamagnetic signal, e.g. of up to 5% of absolute diamagnetism ($X=-\frac{1}{4}\pi$) or more (e.g., at temperatures ranging from 4K-300K). In some embodiments, the material may exhibit high temperature superconductivity.

In another aspect, a material is described including a composition $Sr_2RuO_{4-y}S_y$, where y is in the range of, e.g., 0.1-1.2. In some embodiments y is in the range of 0.1-0.6. In some such embodiments, the material may exhibit a strong diamagnetic signals, e.g. of up to 5% of that of absolute diamagnetism (e.g., at temperatures ranging from 4K-300K).

Ceramic samples of $Sr_2RuO_{4-y}S_y$ (y=0.03-1.2) with intended isovalent substitution of oxygen by sulfur have been synthesized and explored in the temperature range 4-300K. It is found that at a range of sulfur substitution the magnetic response of ceramic samples reveals large diamagnetic signal with amplitudes approaching comparability with that of the YBCO-superconductors.

Contrary to a pure ceramic $Sr_2RuO_4$, in some embodiments, the resistivity of sulfur-substituted samples has a metallic behavior except at lower temperatures where an upturn occurs. Both exemplary synthesis conditions and results of measurements are reported. The Meissner effect indicates high-temperature superconductivity in these materials.

In one aspect, a method of making a material is disclosed, the method including: synthesizing a composition $Sr_2RuO_{4-y}S_y$. In some embodiments, y is in the range of 0.1-1.2. In some embodiments, y is in the range of 0.1-0.6.

In some embodiments, the material exhibits a strong diamagnetic behavior.

In some embodiments, the material includes a high temperature superconductor.

In some embodiments, synthesizing the composition $Sr_2RuO_{4-y}S_y$ includes: annealing a mixture of precursor materials at a baseline temperature $T_1$ for a heating period; and during one or more enhanced heating sub-periods of the heating period, annealing the mixture at an enhanced heating temperature $T_2 > T_1$.

In some embodiments, the precursor materials include $SrCO_3$, $RuO_2$, and at least one selected from the list consisting of SrS and $SrSO_4$.

Some embodiments include, prior to annealing the mixture of precursors, annealing the $RuO_2$ precursor and then storing the annealed $RuO_2$ precursor in a vacuum desiccator.

In some embodiments, annealing the $RuO_2$ precursor includes annealing the $RuO_2$ precursor at a temperature of at least about 800° C. for at least about 3 hours. In some embodiments, annealing the $RuO_2$ precursor comprises annealing the precursor to remove substantially all moisture from the precursor.

In some embodiments, $T_1$ is about 1100° C. In some embodiments, $T_2$ is about 1150° C.

In some embodiments the heating period is about 7 hours and each of the one or more sub periods is about 0.5 hours. In some embodiments, the one or more sub periods include at least 3 sub-periods.

In another aspect, a material is disclosed including: a composition $Sr_2RuO_{4-y}S_y$, in some embodiments y is in the range of 0.1-1.2. In some embodiments, y is in the range of 0.1-0.6.

In some embodiments, the material exhibits a strong diamagnetic behavior. In some embodiments the material includes a high temperature superconductor.

In some embodiments, the composition includes a dopant. In some embodiments the dopant includes silver at about 4% by weight of the composition.

Various embodiments may include any of the above described elements or steps, either alone or in any suitable combination.

BRIEF DESCRIPTION OF THE DRAWINGS

FIG. 4 shows magnetometer calibration runs. Panel A shows the Curie-Weiss behavior of χ(T) of $Gd_2O_3$ (0.65 g pellet) measured by our magnetometer. Panel B shows the empty coil outputs.

DETAILED DESCRIPTION

Exemplary Methods of Making a Strontium Ruthenate Material

In various embodiments, a composition $Sr_2RuO_{4-y}S_y$ may be formed, e.g., with y=0.001-1.0, or other suitable values using techniques of the type described herein. In some embodiments, the composition is formed using a solid phase synthesis. The ingredients may include, consist of, or consist essentially of ingredients $SrCO_3, RuO_2$, and SrS. The purity of each ingredient may be about 99% or greater, about 99.9% or greater, about 99.99% or greater, about 99.995% or greater, etc. e.g., in the range of about 99.99%-99.999% or any subrange thereof. These components may be mixed, e.g. in the (2-y):1:y molar weight proportion in any suitable mixing vessel (e.g., in an agate mortar). In other embodiments, other suitable proportions may be used.

In various embodiments, any suitable mixing duration may be used, e.g., about 0.5-1.5 hours per gram of weight or any subrange thereof. The mixture may then be annealed, e.g., in a furnace.

Figure 1:
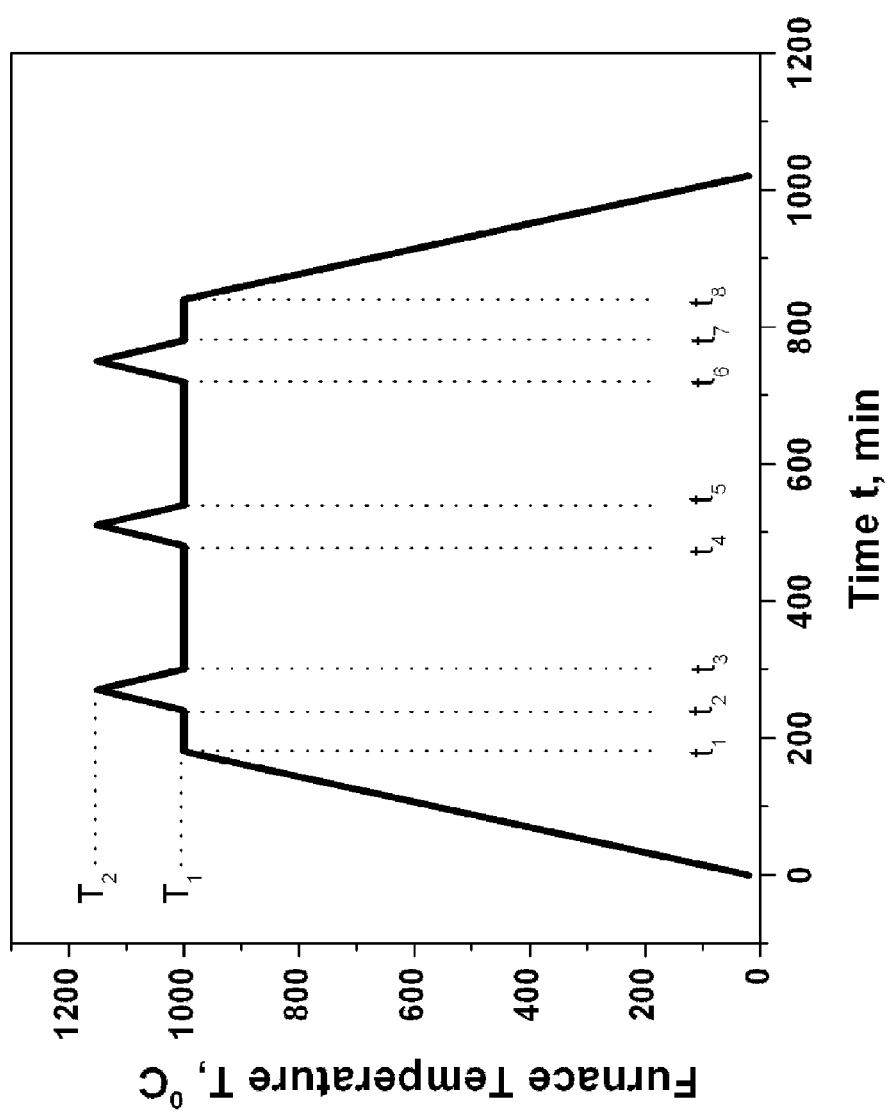
FIG. 1 shows a temperature diagram of pellets treatment at final stage. Although exemplary parameters are shown, parameters t1-t8 and T1 and T2 may be varied in various embodiments, e.g., as described in the examples below.

In some embodiments, the annealing heat treatment may include an initial temperature ramp up to a baseline temperature $T_1$. After heating to the baseline temperature $T_1$, the temperature may be held at about the baseline temperature $T_1$ during a heating period. In some embodiments, the annealing temperature may be increased to an enhanced heating temperate $T_2$, e.g., for one or more enhanced heating sub-periods of the heating period. After the heating period, the temperature is reduced during a cool down period. FIG. 1 shows an exemplary plot of annealing furnace temperature as a function of time for an annealing process of the type described above, featuring three enhanced heating sub periods. However it is to be understood that in various embodiments, any suitable number of enhanced heating sub periods may be used, e.g., zero, one, two, three, four, five, etc.

The ramp up, heating period and the enhanced heating sub periods, and cool down period may be of any suitable duration, and may be arranged in any suitable relation to one another. For example, the duration of the ramp up to the baseline temperature $T_1$ (e.g., from room temperature or any other suitable starting temperature) may be one hour or more, two hours or more, three hours or more, etc., e.g., in the range of 0.10-10.0 hours or any subrange thereof. The duration of the cool down from the baseline temperature $T_1$ (e.g., to room temperature or any other suitable cooled temperature) may be one hour or more, two hours or more, three hours or more, etc., e.g., in the range of 0.10-10.0 hours or any subrange thereof. The baseline heating period may have a duration of, e.g., one hour or more, two hours or more, three hours or more, etc., e.g., in the range of 0.10-10.0 hours or any subrange thereof. Each of the enhanced heating sub-periods may have a duration of e.g., at least 1%, at least 5%, at least 10%, at least 20%, at least 30%, at least 40% or more of the baseline heating period, e.g., in the range of 0.1-99% or any subrange thereof. In some embodiments, one or more of the enhanced heating sub periods may include a temperature rise and a temperature fall. Note that although FIG. 1 shows each of various temperature rises/falls as a linear temperature change as a function of time, in various embodiments, other temperature/time relationships may be used (e.g., polynomial, logarithmic, exponential, etc.).

In some embodiments, the baseline temperature $T_1$ is in the range of 500-1500° C., or any subrange thereof. In various embodiments, the enhanced heating temperature $T_2$ may be in the range of $T_1$=1.0° C. to $T_1$=500° C. or any subrange thereof. In some embodiments, each enhanced heating sub-period may have equal or differing associated enhanced temperatures.

The following provides examples of synthesis techniques with annealing heating cycles that may be used in various embodiments.

Exemplary Materials

The techniques described may be used to provide a new material. In some embodiments, this material demonstrates large-scale diamagnetism, which indicates the presence of the Meissner effect, which, in turn, indicates high-temperature superconductivity (e.g., even more than zero resistance [9]).

Accordingly, in various embodiments, the techniques used herein may be used to produce a material which exhibits superconductivity with a transition temperature greater than about 30K, about 50K, about 100K, about 110K, about 120K, about 130K, about 140K, about 150K, about 160K, about 170K, about 180K, about 190K, about 200K, about 210K, about 220K, about 230K, about 240K, about 250K, 300K, 350K, 400K, or more, e.g., in the range of 100-400K, e.g., exhibiting a transition in the range of 30K-400K or any subrange thereof.

Although a number of embodiments have been described in which a composition having the chemical formula $Sr_2RuO_{4-y}S_y$, it is to be understood that in some embodiments other compounds may be used. In various embodiments, the material may include SR, Ru, O, and S in any proportions. For example in some embodiments, the material may include a sulfur substituted form of any of the materials in the Ruddlesden-Popper family of materials: $Sr_{n+1}Ru_nO_{3n+1}$ (n=1, 2, 3, . . . ).

In some embodiments, the material may include one or more types of dopants added at any suitable weight percent e.g., at about 4%, in the range of 1-10% or any subrange thereof (e.g., 1-6%, 2-5%, 3-4%, etc.). In some embodiments, the dopant may Ni, Cr, Fe, Co, Cu, Au, Pt, As, Sb, Se, Te, Na, Cl or combinations thereof. In some embodiments, a dopant of Ag, Au, or Pt may be advantageous.

It is further notable that ceramic materials (and related synthesis techniques) of the type described herein feature a number of advantages over other techniques (e.g., laser-processed single-crystals [2-4]). Laser processed materials suffer from a lack of reproducibility and produce samples easily destroyed by thermocycling. In various embodiments the techniques and materials described herein may be more robust. In many cases, ceramics may be obtained with highly repetitive yield.

Furthermore, in some embodiments the cost per sample is lower that other techniques (e.g., orders of magnitude lower than the laser-processed single crystals), with similar benefits seen in the timeline per sample preparation.

However, it is to be understood that in some embodiments, the techniques described herein may be extended, e.g., to the growth of crystals or thin films of the materials described herein.

Exemplary Applications

Materials of the type described herein may be used in any number of applications, e.g., in any application where high temperature superconductors are known to be of advantageous use (e.g., as described in [13]). The following provides a non-exhausted list of examples of such applications.

In some embodiments, materials of the type described herein may be used (e.g., as magnet winding elements or other components) in rotating alternating current (AC) machines. Such machines may include generators or motors. For example, superconducting materials of the type described herein may be used to replace copper windings in the rotator and stator of conventional devices.

In some embodiments, materials of the type described herein may be used (e.g., as magnet winding elements or other components) in rotating direct current (DC) homopolar machines (e.g., based on the famous Faraday disk machine). Such machines may include generators or motors. Such devices may be incorporated in a maritime ship's integrated power distribution and motor drive system, providing improved efficiency, noise reduction, and other benefits.

In some embodiments, materials of the type described herein may be used (e.g., as magnet winding elements or other components) in synchronous AC homopolar machines. Such machines may include generators or motors.

In some embodiments, materials of the type described herein may be used (e.g., as winding elements or other components) in transformers. For example, superconducting materials of the type described herein may be used to replace copper windings found in conventional transformers. Superconducting transformers may have significant benefits over conventional devices, including reduced size and weight, longer life, higher efficiency, easy integration into superconducting power systems, etc.

In some embodiments, materials of the type described herein may be used in superconducting fault current limiting devices. In some embodiments, such devices exploit the superconductor's transition from low (e.g., zero) resistance at normal current to higher resistance at higher currents, thereby automatically limiting fault currents. Such devices may include resistive, inductive, or other types of fault current limiters.

In some embodiments, materials of the type described herein may be used in power cables, e.g., suitable for use in an electrical power distribution grid. Such power cables may have numerous advantages over conventional metal wires including higher current carrying capability, reduced thermal losses, reduced or eliminated stray electromagnetic field emissions, reduced impedance, etc. Such devices may be used to transfer electricity over long distances with lower losses than conventional techniques (currently, about 15% of generated electric power is being lost during transfer).

In some embodiments, materials of the type described herein may be used (e.g., as winding elements or other components) in electromagnets, e.g., air core or solid core magnets. Advantages over conventional magnets include increased efficiency and higher magnetic fields. Such magnets may be used in any number of applications including, e.g., medical imaging, energy storage, magnetic separation, particle beam guiding, synchrotron applications, etc.

In some embodiments, materials of the type described herein may be used in magnetic levitation (maglev) devices. Such devices may be used in locomotives/railways or other vehicles or transport systems.

In various embodiments, materials of the type described herein may be used in a variety of other applications including detectors (e.g., superconducting quantum interference detectors, bolometers, Josephson junctions, etc.), digital circuit elements (e.g., single flux quantum devices), radio frequency and microwave filters (e.g., for mobile communication devices)

EXPERIMENTAL EXAMPLES

Applicants conducted an investigation of ceramic samples with the projected composition $Sr_2RuO_{4-y}S_y$. With the entrance of sulfur, novel results began to appear rather quickly. Moreover, the reproducibility of the samples turned out to be good, especially for the diamagnetic susceptibility, which does not depend essentially on intergranular linking Sample Preparation In the following examples, synthesis of the composition $Sr_2RuO_{4-y}S_y$, with y=0.03, 0.1, 0.3, 0.45, 0.65, 0.85 and 1.0 was undertaken via solid-phase synthesis route using initial ingredients $SrCO_3$ (99.994%), $RuO_2$ (99.95% purity), and SrS (99.995%). In some cases, SrS was replaced by $SrSO_4$ (99.995%). These components were mixed in the (2−y):1:y molar weight proportion in an agate mortar (mixing duration about 1 hour per gram of weight), and annealed about 10 hours in air at the temperature 1000° C. using a muffle furnace (MTI CMF-1100, some heat treatments have been performed in high-temperature muffle furnace KSL-1700TX). The temperature was changed at the speed about 4° C./min.

After this heat treatment the mixtures underwent grinding in the same mortar and subsequently were pelletized (pellets ¼ inch in diameter, about 500 mg in weight). These pellets have been annealed in the same furnace, for 10 hours at 1000° C. The furnace heating took place at the speed 4° C./min, and cooling at 100° C./hour. During 1000° C. treatment the temperature was raised fast to 1150° C. (in 30 min), and lowered with the same speed three times (FIG. 1).

Several variations of the parameters outlined in FIG. 1 were tried. The durations shown yielded advantageous results. In some cases, the parameter $T_1$ was increased (e.g., up to 1080° C.), and the durations of the intervals $t_3$-$t_4$, $t_5$-$t_6$ were increased. For example, in some cases a duration of 120 minutes was used instead of a 60 minute duration, in order to facilitate intergrannular connections.

Figure 2:
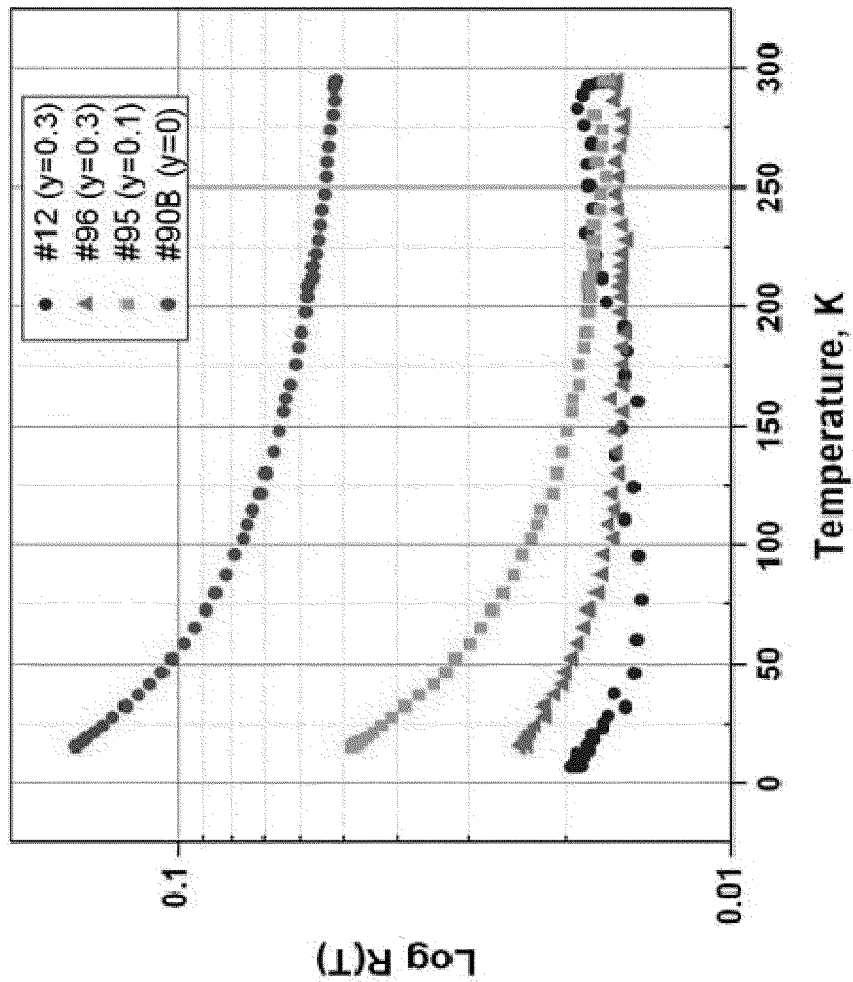
FIG. 2 illustrates resistivity reduction and "metallization" at optimal values of 'y'. On the vertical scale, the units are such that R(300K) corresponds to the resistivity ~30 mOhm-cm for sample #90B having y=0.

Ceramics of pure $Sr_2RuO_4$ have resistivity of semiconductor type in the whole scale of room to absolute zero temperatures (see, e.g., [5]), although high-quality single crystals of the same material have metallic behavior in the (ab)-plane and (below some temperature) along the c-axis [6]. Most likely, semiconductor intergranular links are responsible for this difference. We found that the addition of sulfur gradually facilitates the metallization. Moreover, the conductivity at room temperatures monotonically increases, reaches a maximum, and then decreases as sulfur concentration increases. The concentration of sulfur that maximizes the conductivity at room temperature is designated "optimal". For sulfur concentrations close to the optimal, the dependence of resistance on temperature has metallic shape from the room to about 50-100K, and then has an upturn. For the best samples tested, these upturn values do not exceed the room-temperature level even at temperatures as low as 4K. The curves corresponding to some samples with different values of the parameter 'y' of compositional formula are shown in FIG. 2.

In some embodiments, this process of resistivity optimization is very sensitive to preparation conditions: minor differences strongly affect the conductivity, as clear from comparing the samples #12 and #96.

Diamagnetic Response of Samples

Figure 3:
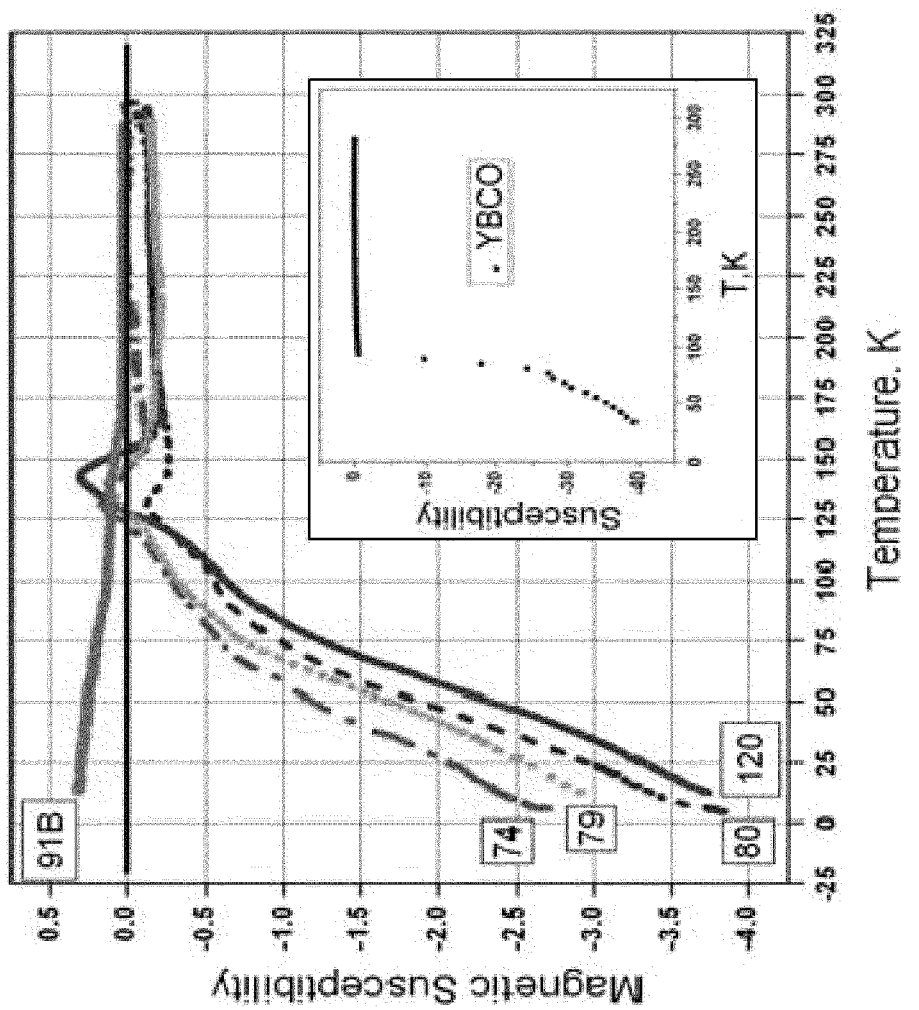
FIG. 3 shows a plot of magnetic susceptibility vs. temperature of samples with y=0 (#91B), y=0.1 (#74 and #120), y=0.3 (#80), and y=0.4 (#79). Inset shows the result for the same size YBCO pellet measured by the same apparatus. The units are such that ¼πemu=88.

For a range of y-values, y~0.1-0.6, which also includes the range of optimum resistivity, the samples demonstrate very strong diamagnetic signals, up to 10% of that of YBCO superconductors, as shown in FIG. 3. Note, in the context of this discussion it is convenient to express susceptibility results in the "YBCO-units". As we found, this particular sample of YBCO has $\chi$(4K) about the half of the absolute diamagnetic value ($-\frac{1}{4\pi}$)emu.

Referring to FIG. 3, the drastic change in the character of magnetic behavior between pure $Sr_2RuO_4$ (sample #91B) and the sulfur-substituted species is apparent. Also, despite the fact that the curves are not as sharp as in the case of mostly single-phase YBCO superconductor shown in the inset, the diamagnetism is too large to be attributed to usual metallic diamagnetism. The usual diamagnetism typically has the order of paramagnetic response demonstrated by the sample #91B in FIG. 3 between the temperatures 160K to 300K. At lower temperatures, the minor inclusions of the other phases of strontium ruthenates (such as $SrRuO_3$, which is ferromagnetic below 160K), are very likely in ceramics, and their contribution is dominating in absence of sulfur. So, it is plausible to attribute large negative diamagnetism to the Meissner effect in these ceramics. According, some embodiments of materials produced using the techniques described herein may exhibit the Meissner effect at high temperatures (e.g., in the range of 160K-300K, or any subrange thereof).

Note that deviation of magnetic susceptibility from zero towards negative values starts at room temperatures. The experimental measurements described herein have been performed using Maxwell-Wien type double-coil bridge. No dc magnetic field was applied. The Earth's field was not screened.

Figure 4:
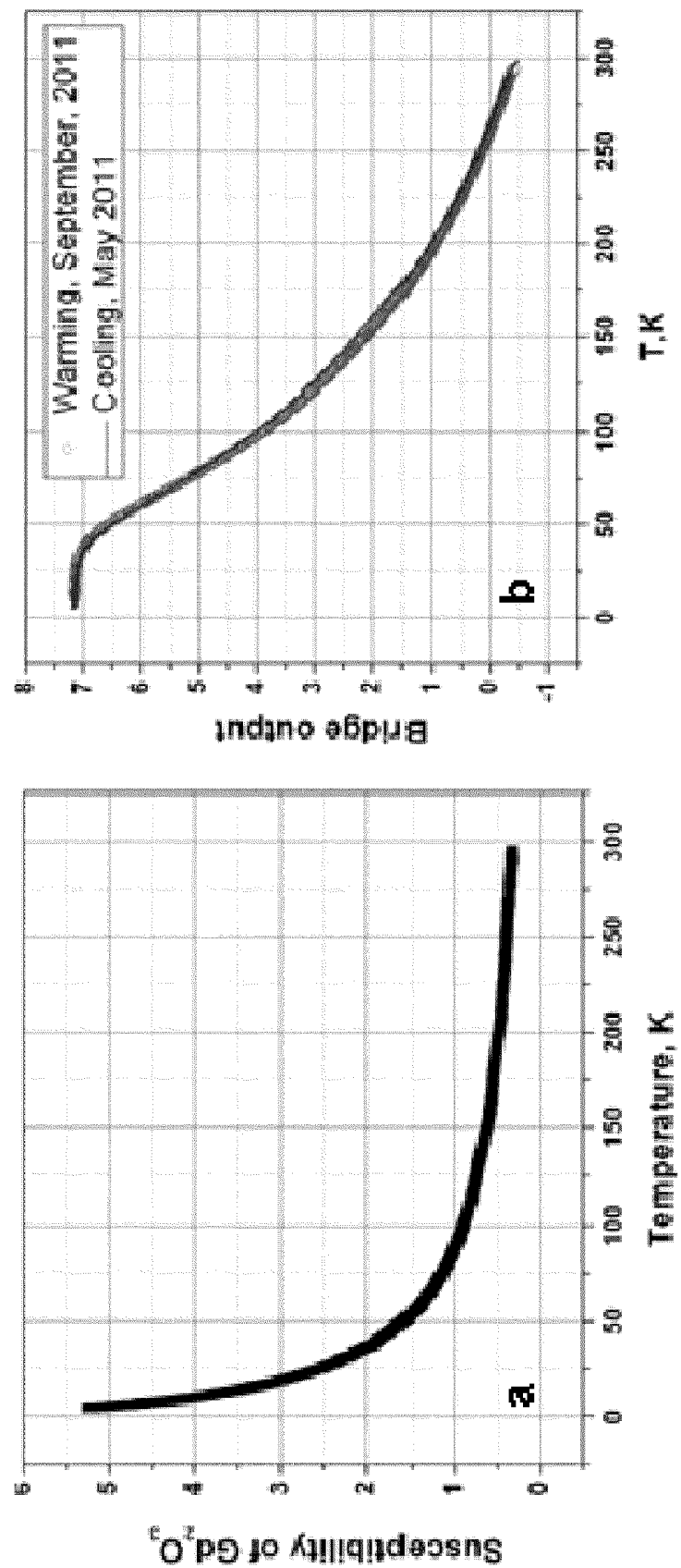
FIG. 4.

Careful analysis of the measurement device established its good sensitivity and high accuracy. FIG. 4 (panel A) documents calibration curve taken on $Gd_2O_3$ of 99.999% purity with approximately same sizes.

Since this material has exact Curie-Weiss character, we used it and the published data on this material [7] to calibrate our instrument. To finish with describing the stability of reading of our magnetometer we have shown in FIG. 4 (panel) the curves obtained with its empty coil for different calibration runs (cooling and warming curves separated by many months of time interval are coinciding well).

Discussion of Results

The discovered magnetic response is quite stable against thermocycling, and is highly reproducible at synthesis. To achieve high reproducibility, among other things, one should be aware of hygroscopic nature of $RuO_2$. Even powders "containerized under argon" may have up to 12% of moisture. For our initial series of samples we did not subjected $RuO_2$ to any thermal pre-annealing, but later found it to be very important for reproducibility. Good reproducibility was obtained by annealing of $RuO_2$ at 800° C. for 3 hours, and then storing it in a vacuum desiccator: with this precaution no noticeable weight changes occur during some months of storing.

We also noticed by proper measurement of weights during different stages of sample preparation that the suggestion of "isovalent substitution" is indicated for smaller values of 'y'. For example, one of the samples (#121) having a composition $Sr_2RuO_{3.9}S_{0.1}$ had initial weight of ingredients 507 mg (sulfur was introduced via $SrSO_4$), and final weight 402 mg, which corresponds to 20.7% of weight loss vs. 20.8% of theoretical weight loss at the isovalent substitution. In cases with higher values of 'y' this accordance was not as perfect. A 10% difference was typical. It is not excluded that the deviation from the theoretical estimates based on isovalent substitution plays an important role in defining the physical properties of samples.

We performed x-ray diffraction analysis of different pellets (using SIEMENS-D-500 diffractometer). This analysis assures that the structure of $Sr_2RuO_4$ is not essentially changed by the sulfur substitution, though sulfur-substituted samples have some reflections absent in pure $Sr_2RuO_4$ (FIG. 5).

Figure 5:
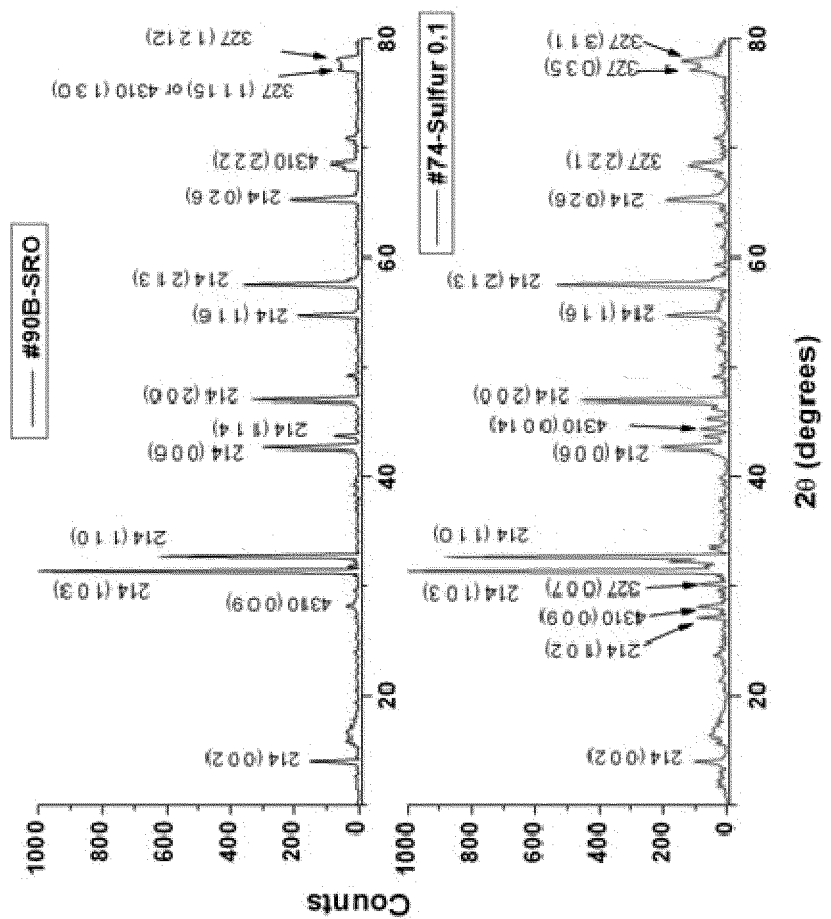
FIG. 5 shows an X-ray diffraction measurement comparison of $Sr_2RuO_4$ with $Sr_2RuO_{4-y}O_y$, in case y=0.1.

Referring to FIG. 5, both diffractograms reflect the 214 (n=1) phase of the Ruddlesden-Popper family of materials $Sr_{n+1}Ru_nO_{3n+1}$ (n=1, 2, 3, . . . ) as the major phase, though some representatives of other values of n are present (more in the case of sulfur-containing sample #74). The presence of these phases is typical as reflected in the literature (see, e.g., [5]). Not wishing to be bound by theory, we note that in some cases that sulfur insertion may act like doping and changes directly the electronic system of the samples.

To be highly cautious, one may expect that the Meissner effect, even with accompanying resistive transition, cannot conclusively establish the occurrence of superconductivity. The Ruddlesden-Popper family of materials: $Sr_{n+1}Ru_nO_{3n+1}$ (n=1, 2, 3, . . . ), which is basic for our modified composition, may reveal very sophisticated metamagnetic properties, as well as resistive transitions (see, e.g., [9]). However, to the best of our knowledge, these materials never demonstrated (large) diamagnetism. It is notable that this behavior described above is obtained in the absence of large magnetizing fields (e.g., in contrast to the diamagnetism observed in some orthovanadates [10], but only in response to applied kOe-scale fields).

In some embodiments, one may continue and modify the approach described above, to reveal possibly hidden resistive transitions in accordance to a model excellently described by Kresin and Wolf [11]. One may accomplish this by breaking high-resistance (intergranular) barriers and allowing the proximity effect to reveal possible superconductivity. Also, one can use other substitutions instead of sulfur. In some embodiments, Se and As may be used.

Figure 6:
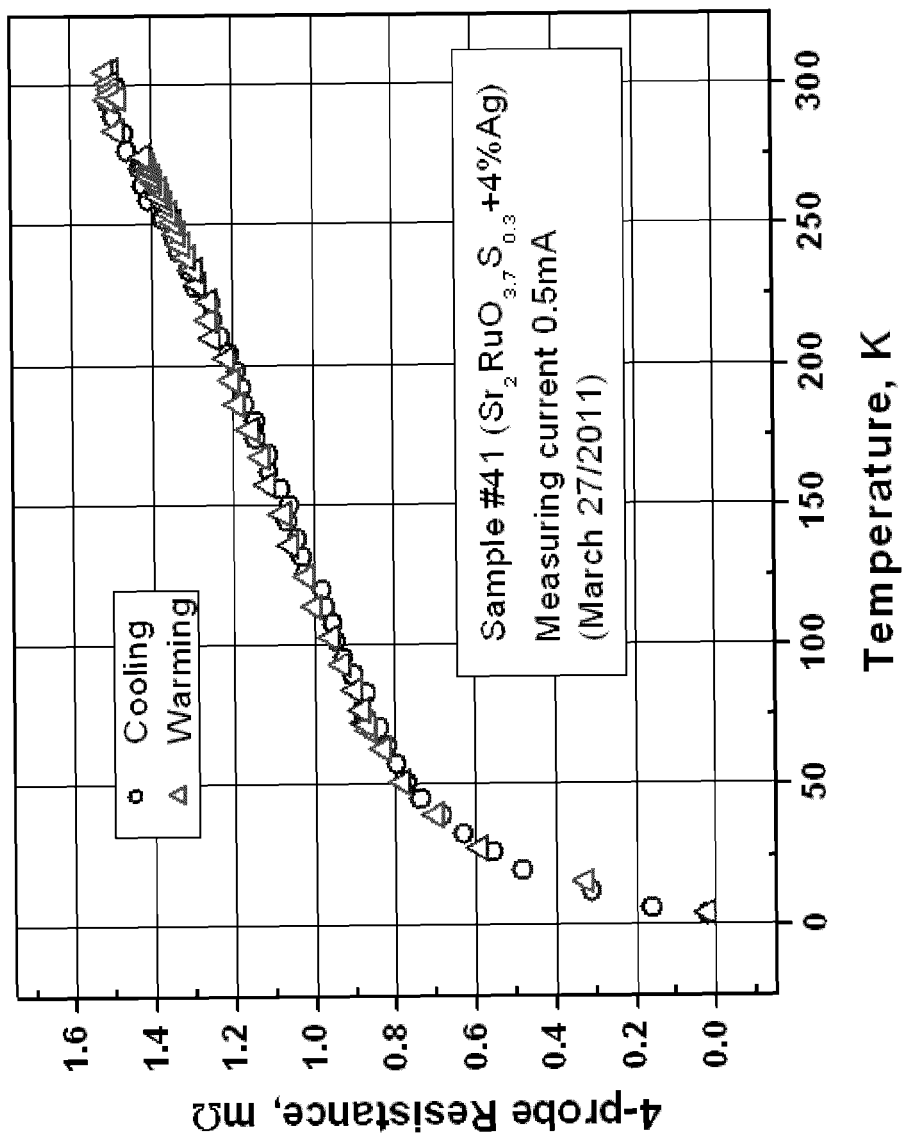
FIG. 6 illustrates a resistive transition in a silver-doped strontium ruthenate sample. Four probe resistance is plotted vs. temperature during both warming and cooling of the sample.

In one experiment designed to highlight a resistive transition, we started with some of the same powder as had been used for close to the optimum sulfur concentration pellets. We then added different amount of silver powder (spherical, 0.5-1 µm, 99.9%) using a miniature silver spoon. The powders were then mixed in the agate mortar for about 4 hours per gram of mixture, and then first annealed at 800° C. (for 3 hours, rise time 1.5 hours, fall time 2 hours), then re-grinded, pelletized and annealed at 1000° C. for 10 hours (rise time and fall time each 3 hours). During this annealing, like before (FIG. 1), there have been 3 temperature rises this period up to 1150° C., with rise time and fall time half hour each. This procedure revealed an optimum concentration for added silver, which in case of y=0.3 was found to be about 4% (weight percents). Two samples at this concentration of silver dopants revealed the resistive transition as shown in FIG. 6.

These two samples were cryogenically cooled many times, removed from holder between measurements and stored for days. All permutations between four leads have been done, and different measuring current magnitudes were tried.

Note that although one example of a silver doped material has been described above, in various embodiments silver, or other suitable dopants may be used with any of the materials described herein. For example, any of the following dopants may be used in some embodiments in any suitable combination and amount: Ni, Cr, Fe, Co, Cu, Au, Pt, As, Sb, Se, Te, Na and Cl.

In various embodiments the weight percent of applied dopant may vary, e.g., in the range of 0-10%, or any subrange thereof. In some embodiments, even more that 10% dopant by weight may be used.

Careful examination of our $\chi(T)$ curves, as shown in FIG. 3, demonstrates that there are two descends (the lower temperature one with a shoulder) of the susceptibility towards negative values and one hump towards the positive values of susceptibility. Note that susceptibility first enters negative domain at almost normal room temperatures. This may be indicative of high temperature (e.g., room temperature) superconductivity in some of the grains of this material.

Figure 7:
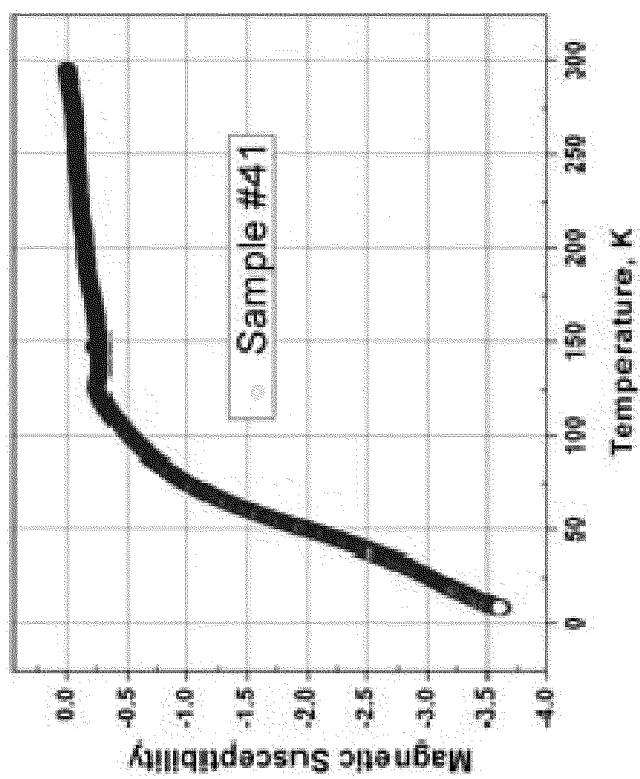
FIG. 7 shows a plot of magnetic susceptibility vs temperature for a silver-doped strontium ruthenate sample of FIG. 6.

We anticipate the behavior of the hump to be strongly magnetic field dependent. Not wishing to be bound by theory, in some cases this may be indicative of an undesired ferromagnetic, or super-paramagnetic, or meta-magnetic phase in the material. In some embodiments, this phase may be reduced or eliminated. Note that in one of the experimental samples we were able to greatly reduce the hump, as shown in FIG. 7. This is the sample which demonstrated resistive transition (as shown in FIG. 6).

Turning to resistive transitions, again, not wishing to be bound by theory, in some cases the results with the transitions similar to the plotted in FIG. 6, may be due to the microbridges between superconducting granules which silver connectors helped to build. As we mentioned, the corresponding physical model is described by Kresin and Wolf [11].

In some embodiments, one may build improved microbridges, e.g., by using materials other than silver and/or varying the preparation conditions (e.g., the annealing temperatures and temperature duration segments described above).

Samples of the type described herein may be characterized via microanalysis using electron microscopy. Using such techniques, we have seen dendrites on some surfaces of synthesized ceramics. In various embodiments, such dendrites may help or hinder indications of superconductivity, and sample preparation may be adjusted accordingly to reduce or enhance the presence of such structures.

As noted above, x-ray analysis of samples has been performed, and obtained preliminary results (FIG. 5), which confirm that the major structure of strontium ruthenate stays intact as sulfur is added but there are some deviations from it. In some embodiments, one may associate these deviations with observed properties and correlate them, if such a correlation is existent, with each other. For example, one may x-ray samples with typical or unique behavior and create an archive for each separate composition. The data may be used to guide sample preparation, e.g., to maximize the Meissner amplitude and find the conditions for reproducible resistive transition in various situations. The x-ray measurements may also be used to characterize chemical composition of the phase responsible for superconductivity. Some materials of the type described herein, as in other layered oxides, may have properties (like $T_c$) that improve with the number of conductivity layers in the unit cell. In such cases, the number of layers in the unit cell may be increased, e.g., using any suitable techniques known in the art. For example, in some embodiments, one may determine which layer in the unit cell is responsible for conductivity. Next, one may establish exact formula unit. Third, one may reveal formula units with more or higher conductive layers. Fourth, based these formulas, one may synthesize appropriate materials, each of which may have its own preparation conditions.

Conclusion

The scope of the present invention is not limited by what has been specifically shown and described hereinabove. Those skilled in the art will recognize that there are suitable alternatives to the depicted examples of materials, configurations, constructions and dimensions. Numerous references, including patents and various publications, are cited and discussed in the description of this invention. The citation and discussion of such references is provided merely to clarify the description of the present invention and is not an admission that any reference is prior art to the invention described herein. All references cited and discussed in this specification are incorporated herein by reference in their entirety.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

Variations, modifications and other implementations of what is described herein will occur to those of ordinary skill in the art without departing from the spirit and scope of the invention. While certain embodiments of the present invention have been shown and described, it will be obvious to those skilled in the art that changes and modifications may be made without departing from the spirit and scope of the invention. The matter set forth in the foregoing description and accompanying drawings is offered by way of illustration only and not as a limitation.

References

[1] A. M. Gulian and V. R. Nikoghosyan, arXiv: cond-mat/1109.5385 (2011).
[2] A. M. Gulian, K. S. Wood, D. Van Vechten, J. Claassen, R. J. Soulen, Jr., S. Qadri, M. Osofsky, A. Lucarelli, G. Lüpke, G. R. Badalyan, V. S. Kuzanyan, A. S. Kuzanyan, V. R. Nikoghosyan, arXiv: cond-mat/0509313 (2005).
[3] A. M. Gulian, V. R. Nikoghosyan, D. Van Vechten, K. S. Wood, arXiv: cond-mat/0705.0641 (2006).
[4] A. M. Gulian, V. R. Nikoghosyan, in: T. Frias, V. Maestas (Eds.), Bulk Materials: Research, Technology and Applications, Nova Science Publishers, Inc., New York, 2010.
[5] J. J. Neumeier, M. F. Hundley, M. G. Smith, J. D. Thompson, C. A. Allgeier, H. Xie, W. Yelon, J. S. Kim, Phys. Rev. B 30 (1994) 17910.
[6] A. P. Mackenzie, Y. Maeno, Rev. Mod. Phys. 75 (2003) 657.
[7] S. L. Bud'ko, P. C. Canfeld, arXiv: cond-mat/0503110v1 (2005).
[8] I. I. Mazin, Nature, 464, (2010) 183.
[9] S.-I. Ikeda, Y. Maeno, S. Nakatsuji, M. Kosaka, Y. Uwatoko, Phys. Rev. B 62 (2000) R6089.
[10] H. N. Nguen, J. B. Goodenough, Phys. Rev. B 52 (1995) 324.
[11] V. Z. Kresin, S. A. Wolf, arXiv: cond-mat/1109.034v1 (2011).
[12] X. L. Cross, X. Zheng, P. D. Cunningham, L. M. Hayden, S. Chromik, M. Sojkova, V. Strbik, P. Odier, R. Sobolewski, IEEE Trans. Appl. Supercond. 19 (2009) 3614.
[13] S. S. Kalsi, Applications of High Temperature Superconductors to Electric Power Equipment; Wiley (2011)
[14] http://en.wikipedia.org/wiki/Superconductivity, accessed Nov. 15, 2011

What is claimed is:

1. A method of making a material, the method comprising: synthesizing a composition $Sr_2RuO_{4-y}S_y$, wherein y is substantially greater than 0 and less than or equal to 1.2.

2. The method of claim 1, wherein y is in the range of 0.1-1.2.

3. The method of claim 2, wherein y is in the range of 0.1-0.6.

4. The method of claim 3, wherein the material exhibits a strong diamagnetic behavior.

5. The method of claim 4, wherein the material comprises a high temperature superconductor.

6. The method of claim 3, wherein synthesizing the composition $Sr_2RuO_{4-y}S_y$ comprises:
   annealing a mixture of precursor materials at a baseline temperature $T_1$ for a heating period; and
   during one or more enhanced heating sub-periods of the heating period, annealing the mixture at an enhanced heating temperature $T_2 > T_1$.

7. The method of claim 6, wherein the precursor materials include $SrCO_3$, $RuO_2$, and at least one selected from the list consisting of SrS and $SrSO_4$.

8. The method of claim 7, further comprising, prior to annealing the mixture of precursors, annealing the $RuO_2$ precursor and then storing the annealed $RuO_2$ precursor in a vacuum desiccator.

9. The method of claim 8, wherein annealing the $RuO_2$ precursor comprises annealing the $RuO_2$ precursor at a temperature of at least about 800° C. for at least about 3 hours.

10. The method of claim 6, wherein $T_1$ is about 1100° C.

11. The method of claim 10 wherein $T_2$ is about 1150° C.

12. The method of claim 11, wherein the heating period is about 7 hours and each of the one or more sub periods is about 0.5 hours.

13. The method of claim 12, wherein the one or more sub periods comprise at least 3 sub-periods.

14. A material comprising:
   a composition $Sr_2RuO_{4-y}S_y$, wherein y is substantially greater than 0 and less than or equal to 1.2.

15. The material of claim 14, wherein y is in the range of 0.1-1.2.

16. The material of claim 15, wherein y is in the range of 0.1-0.6.

17. The material of claim 16, wherein the material exhibits a strong diamagnetic behavior.

18. The material of claim 17, wherein the material comprises a high temperature superconductor.

19. The material of claim 18, wherein the composition comprises one or more dopants comprising at least one selected from the list consisting of: Ni, Cr, Fe, Co, Cu, Ag, Au, Pt, As, Sb, Se, Te, Na and Cl.

20. The material of claim 19, wherein the dopant comprises at least one selected from the list consisting of Au, Ag, and Pt at about 4% by weight of the composition.

* * * * *